(12) United States Patent
Kaplish et al.

(10) Patent No.: US 6,710,731 B1
(45) Date of Patent: Mar. 23, 2004

(54) APPARATUS AND METHOD FOR A DIGITAL TO ANALOG CONVERTER ARCHITECTURE

(75) Inventors: Anurag Kaplish, Mountain View, CA (US); John A. Tabler, San Jose, CA (US)

(73) Assignee: Summit Microelectronics, Inc., San Jose, CA (US)

( * ) Notice: Subject to any disclaimer, the term of this patent is extended or adjusted under 35 U.S.C. 154(b) by 248 days.

(21) Appl. No.: 09/954,543

(22) Filed: Sep. 10, 2001

(51) Int. Cl.[7] ............................................. H03M 1/78
(52) U.S. Cl. ..................... 341/154; 341/144; 341/156
(58) Field of Search ............................. 341/144, 156, 341/155, 138, 136, 154

(56) References Cited

U.S. PATENT DOCUMENTS

| | | | |
|---|---|---|---|
| 4,837,572 A | * | 6/1989 | Gulczynski ................. 341/144 |
| 5,703,588 A | * | 12/1997 | Rivoir et al. ............... 341/159 |
| 5,841,382 A | * | 11/1998 | Walden et al. .............. 341/144 |
| 5,867,116 A | * | 2/1999 | Nakamura et al. .......... 341/159 |
| 6,191,720 B1 | * | 2/2001 | Zhang ........................ 341/144 |
| 6,201,491 B1 | * | 3/2001 | Brunolli et al. ............. 341/144 |
| 6,307,490 B1 | * | 10/2001 | Litfin et al. ................. 341/144 |
| 6,445,325 B1 | * | 9/2002 | Burns ......................... 341/144 |
| 6,452,519 B1 | * | 9/2002 | Swanson .................... 341/120 |
| 6,590,517 B1 | * | 7/2003 | Swanson .................... 341/139 |

* cited by examiner

Primary Examiner—Michael Tokar
Assistant Examiner—Lam Mai
(74) Attorney, Agent, or Firm—Fernandez & Associates, LLP

(57) ABSTRACT

Digital-to-analog converter architecture guarantees monotonicity and partial compensation for integral non-linearity. Two stages are separated by a unity-gain operational amplifier, wherein the first stage is a 1-bit resistor string-converter, having one end at reference high voltage, and the other end at reference low voltage, and the second stage is a multi-bit resistor string converter. The architecture relieves matching accuracy necessary for 1-bit front end. Resistor mismatch is compensated by varying buffer amplifier offset-voltage, and ensuring amplifier output is halfway between reference voltages; this improves integral non-linearity, or absolute accuracy, by the amount of mismatch present in the resistor string. Buffer amplifier at output of second stage of DAC controls INL error by varying offset voltage.

6 Claims, 2 Drawing Sheets

APPARATUS AND METHOD FOR A DIGITAL TO ANALOG CONVERTER ARCHITECTURE

FIELD OF INVENTION

The invention relates to an electronic circuit and its operational method, and particularly to a digital-to-analog converter architecture that guarantees monotonicity and partial compensation for integral non-linearity.

BACKGROUND OF INVENTION

Digital-to-analog converters (DAC) process digital signals into analog signals. In particular, high-resolution Nyquist-rate DACs are difficult to achieve, and are required in a wide range of areas, including sensor interfaces, biomedical electronics, and communications. Conventional DAC architectures include resistor string converters, binary scaled converters, and hybrid converters. It is desirable to provide a high-performance DAC architecture, particularly using complementary metal oxide semiconductor (CMOS), bipolar, bi-CMOS, gallium arsenide (GaAs), and other semiconductor process. It would be especially desirable to provide a converter design having guaranteed monotonicity, particularly wherein such converter has a differential non-linearity (DNL) of +/-1 least significant bit (LSB).

SUMMARY OF INVENTION

The invention is embodied in an apparatus and a method for digital-to-analog conversion, particularly using an architecture that guarantees monotonicity and partial compensation for integral non-linearity. Preferred DAC includes two stages separated by a unity-gain operational amplifier, wherein the first stage is a 1-bit resistor string-converter, having one end at reference high voltage, VREFH, and the other end at reference low voltage, VREFL; and the second stage is a multi-bit resistor string converter.

Moreover, a buffer amplifier input is used between two resistors of the 1-bit front-end, and the output is coupled to one end of the multi-bit resistor string. Thus, when the most significant bit (MSB) is a 0, the other end of the multi-bit resistor string is at VREFL via a pass gate. When the MSB is a 1, the end that was connected to VREFL is connected to VREFH via another pass gate.

The architecture relieves matching accuracy necessary for the 1-bit front end. The mismatch of resistors is compensated by varying buffer amplifier offset voltage and ensuring amplifier output is halfway between reference voltages. This architecture improves integral non-linearity, or absolute accuracy, by the amount of mismatch present in the resistor string. A buffer amplifier at the output of the second stage of the DAC controls INL error by varying offset voltage.

DETAILED DESCRIPTION OF PREFERRED EMBODIMENT

Electronic signal conversion architecture and circuit is provided herein, digital-analog (DAC), or optionally analog-digital (ADC), wherein effectively signal monotonicity (i.e., providing consistently increasing value) is guaranteed, and integral non-linearity is at least partially compensated.

Figure 1:
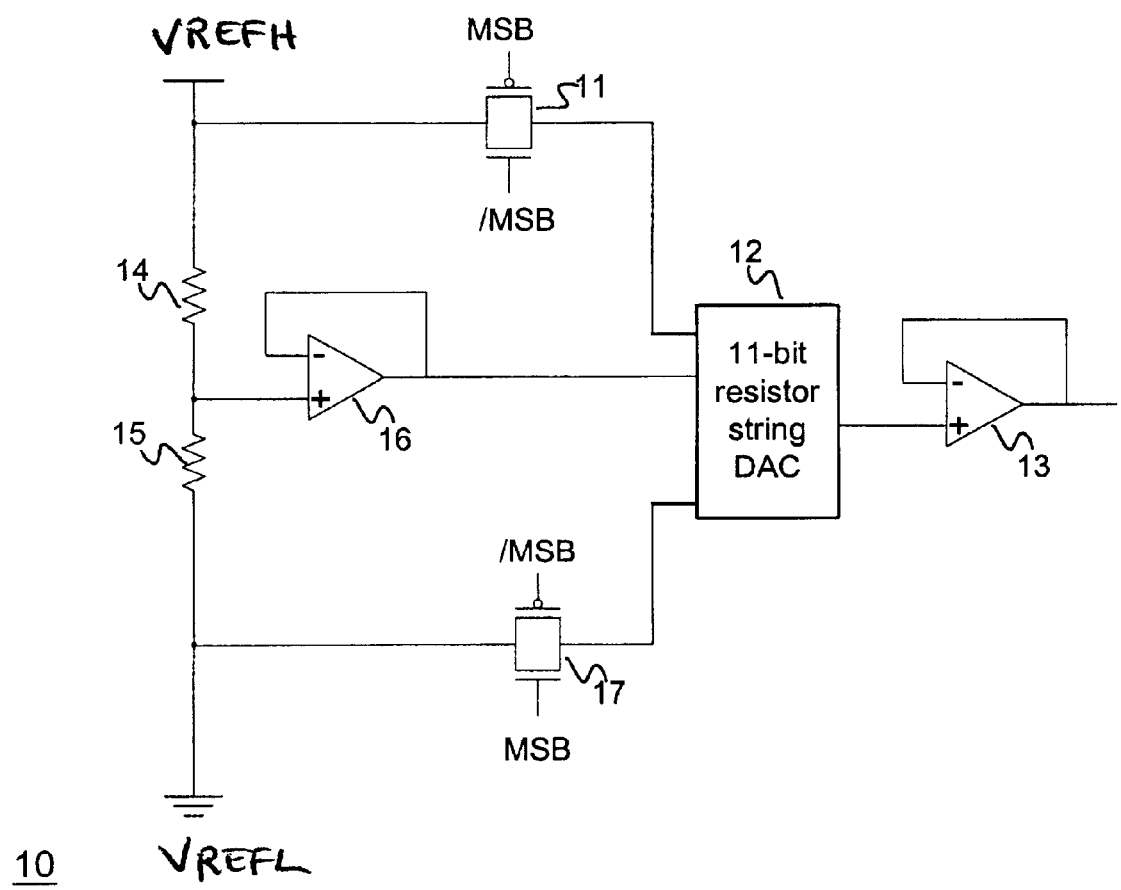
FIG. 1 is a representative circuit schematic for implementing the present invention.
Figure 2:
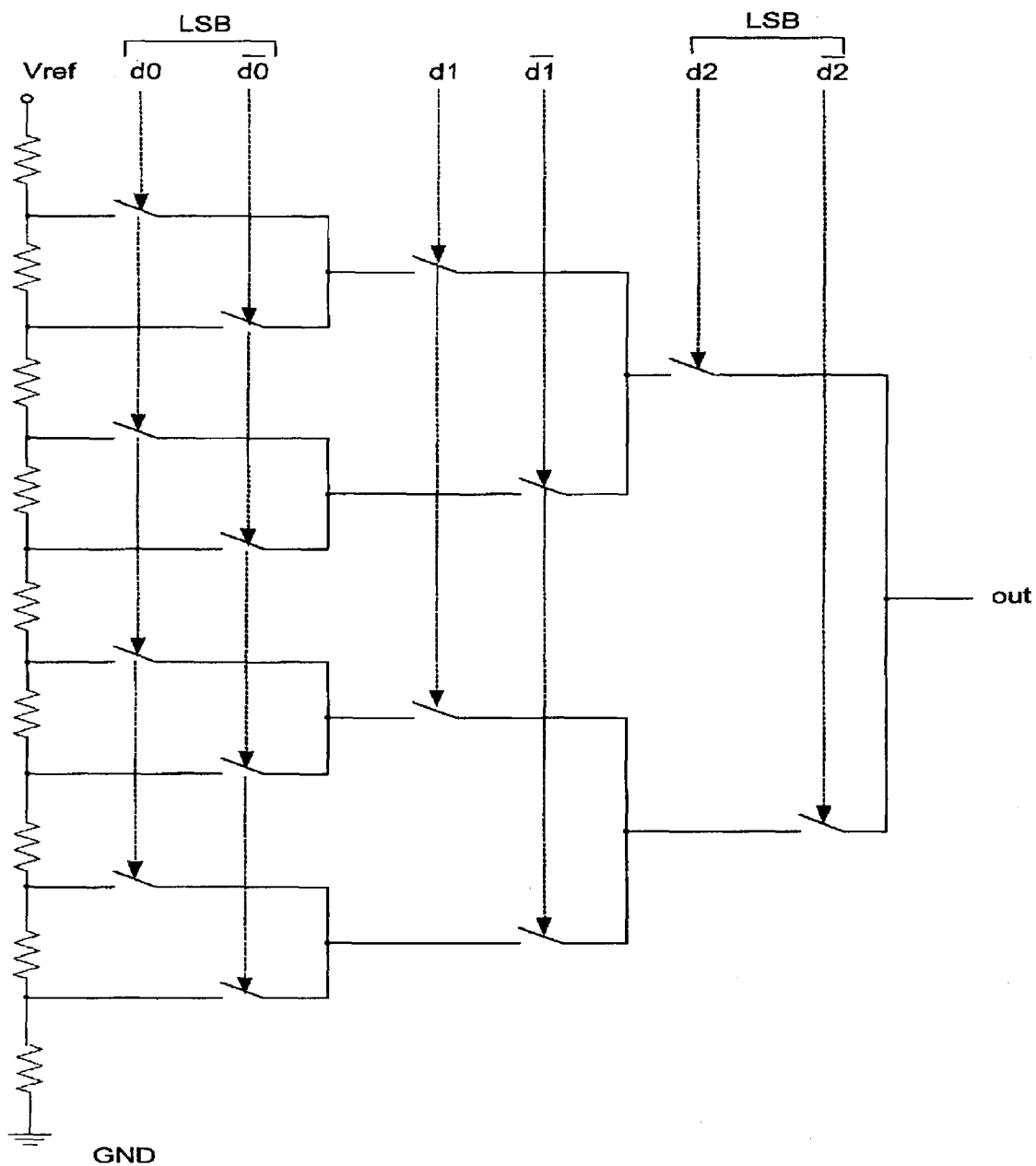
FIG. 2 is a representative resistor-string circuit for implementing the present invention.

Preferred DAC design includes two or more stages separated by a unity or equivalent gain operational amplifier. As shown in FIG. 1, a first circuit or stage is a 1-bit resistor string-converter 14, 15, having one end at reference high voltage, VREFH, and the other end at reference low voltage, VREFL, and a second circuit or stage may be any resistor string DAC, e.g., multi-bit resistor string converter 12, as illustrated in further detail, for example, in FIG. 2.

As shown in FIG. 1, buffer amplifier 16 input may couple between two resistors of 1-bit front-end, and signal output is coupled to one end of multi-bit resistor string. Thus, when most significant bit (MSB) is zero ('0'), the other end of multi-bit resistor string is at VREFL via first pass gate 17. And when MSB is a one ('1'), the end connected to VREFL is connected to VREFH via another pass gate 11. Preferably, pass-gates gates 11, 17 introduce minimal resistance.

Such converter architecture relieves matching accuracy for 1-bit front end. Any mismatch of stage-1 resistors 14, 15 is compensated by varying buffer amplifier 16 offset voltage and ensuring amplifier output is halfway between reference voltages. The architecture improves integral non-linearity, or absolute accuracy by amount of mismatch present in the resistor string.

Additionally, buffer amplifier 13 at output of second stage of DAC controls INL error tunably by varying offset voltage.

Generally, as contemplated in architecture described herein, guaranteed signal monotonicity is achieved at least in part due to: one end of stage-2 circuit resistance being held effectively near or at midpoint between reference high/low voltages; use of resistor stages having fixed tap values; and stage-2 DAC employing resistor string circuitry with taps. Furthermore, it is contemplated that more such stages may be coupled to the present design to improve signal monotonicity guarantee.

Foregoing described embodiments of the invention are provided as illustrations and descriptions. They are not intended to limit the invention to precise form described. In particular, it is contemplated that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by Claims following.

What is claimed is:

1. A digital-to-analog converter comprising:
   a first stage comprising an n-bit resistor string converter for receiving an input digital signal;
   a second stage comprising an m-bit resistor string converter for generating an output analog signal, wherein a unity-gain operational amplifier couples the first and second stages, the converted signal having effectively guaranteed monotonicity;
   the first stage comprises a 1-bit resistor string-converter having a first end at a reference high voltage and a second end at a reference low voltage, and the second stage comprises a multi-bit resistor string converter; and
   a buffer amplifier input couples between a plurality of resistors of the 1-bit resistor string converter, and the output signal is coupled to one end of the multi-bit resistor string; wherein the buffer amplifier offset-voltage is variable for compensating a resistor mismatch.

2. The converter of claim 1 wherein:
   one end of the multi-bit resistor string is coupled to the reference low voltage via a first pass-gate.

3. The converter of claim 1 wherein: one end of the multi-bit resistor string is coupled to the reference high voltage via a second pass-gate.

4. A digital-to-analog signal conversion method comprising the steps of:
- receiving an input digital signal by 1-bit resistor string converter; and
- generating an output analog signal by an multi-bit resistor string converter coupled by a unity-gain operational amplifier to the 1-bit resistor string converter, the converted signal having effectively guaranteed monotonicity; and
- one end of the multi-bit resistor string resistance is held effectively near or at midpoint between a reference high and low voltages.

5. The method of claim 4 further comprising:
- a buffer amplifier couples between a plurality of resistors of the 1-bit resistor string converter, and the output signal is coupled to one end of the multi-bit resistor string, one end of the 11-bit resistor string being coupled to a first pass-gate, another end of the multi-bit resistor string being coupled to a second pass-gate.

6. A digital-to-analog signal conversion method comprising the steps of:
- receiving an input digital signal by 1-bit resistor string converter; and
- generating an output analog signal by an multi-bit resistor string converter coupled by a unity-gain operational amplifier to the 1-bit resistor string converter, the converted signal having effectively guaranteed monotonicity; wherein
- each resistor provided in the 1-bit resistor string converter and the multi-bit resistor string converter has a fixed tap value.

* * * * *